(12) United States Patent
Xu et al.

(10) Patent No.: US 10,490,701 B2
(45) Date of Patent: Nov. 26, 2019

(54) LIGHT EMITTING DIODE CHIP

(71) Applicant: ENRAYTEK OPTOELECTRONICS CO., LTD., Shanghai (CN)

(72) Inventors: Huiwen Xu, Shanghai (CN); Zhengguo Yu, Shanghai (CN); Qiming Li, Shanghai (CN)

(73) Assignee: ENRAYTEK OPTOELECTRONICS CO., LTD., Shanghai (CN)

(*) Notice: Subject to any disclaimer, the term of this patent is extended or adjusted under 35 U.S.C. 154(b) by 92 days.

(21) Appl. No.: 15/578,356

(22) PCT Filed: Sep. 29, 2017

(86) PCT No.: PCT/CN2017/104319
§ 371 (c)(1),
(2) Date: Nov. 30, 2017

(87) PCT Pub. No.: WO2018/059541
PCT Pub. Date: Apr. 5, 2018

(65) Prior Publication Data
US 2019/0221713 A1 Jul. 18, 2019

(30) Foreign Application Priority Data
Sep. 30, 2016 (CN) .......................... 2016 1 0876732

(51) Int. Cl.
*H01L 33/38* (2010.01)
*H01L 33/06* (2010.01)
(Continued)

(52) U.S. Cl.
CPC ............ *H01L 33/385* (2013.01); *H01L 33/06* (2013.01); *H01L 33/32* (2013.01); *H01L 33/382* (2013.01);
(Continued)

(58) Field of Classification Search
CPC ......... H01L 33/00; H01L 33/06; H01L 33/32; H01L 33/42; H01L 33/44; H01L 33/385;
(Continued)

(56) References Cited

U.S. PATENT DOCUMENTS 8,357,552 B2 1/2013 Kao
8,766,281 B2 7/2014 Kao
(Continued)

FOREIGN PATENT DOCUMENTS

CN 101515621 A 8/2009
CN 102130286 A 7/2011
(Continued)

OTHER PUBLICATIONS

International Search Report and Written Opinion from International Application No. PCT/CN2017/104319, dated Nov. 22, 2017.
(Continued)

*Primary Examiner* — Chuong A Luu
(74) *Attorney, Agent, or Firm* — Merchant & Gould P.C.

(57) ABSTRACT

An LED chip comprises: an operation substrate; a first conductive layer disposed on a functional surface of the operation substrate; a die disposed on the first conductive layer, wherein the die comprises a first semiconductor layer and a second semiconductor layer; a first electrode layer electrically connected with the first conductive layer; and a second electrode layer electrically connected with the second semiconductor layer, wherein a first isolation layer is disposed between the second electrode layer and the first conductive layer. In embodiments of the present disclosure, the first electrode layer and the second electrode layer are disposed on the bottom surface of the operation substrate, and are formed after the LED die is formed. Therefore, a dicing process and a packaging process are not required, thus, process steps are simplified and process cost is
(Continued)

reduced, which is conducive to achieve "free packaging" technology.

13 Claims, 4 Drawing Sheets

(51) Int. Cl.
*H01L 33/44* (2010.01)
*H01L 33/40* (2010.01)
*H01L 33/42* (2010.01)
*H01L 33/32* (2010.01)

(52) U.S. Cl.
CPC ............ *H01L 33/405* (2013.01); *H01L 33/42* (2013.01); *H01L 33/44* (2013.01); *H01L 2933/0016* (2013.01)

(58) Field of Classification Search
CPC ....... H01L 33/40; H01L 33/405; H01L 33/38; H01L 33/382; H01L 33/18; H01L 33/26; H01L 33/24; H01L 33/10; H01L 33/08; H01L 33/12; H01L 33/005; H01L 33/60; H01L 31/14; H01L 31/143; H01L 31/16; H01L 31/162

USPC ........................................................... 257/13
See application file for complete search history.

(56) References Cited

U.S. PATENT DOCUMENTS

| | | | |
|---|---|---|---|
| 2010/0096642 A1 | 4/2010 | Chang et al. | |
| 2013/0126928 A1* | 5/2013 | Kao | H01L 33/385 |
| | | | 257/98 |

FOREIGN PATENT DOCUMENTS

| | | |
|---|---|---|
| CN | 201904368 U | 7/2011 |
| CN | 102881783 A | 1/2013 |
| CN | 105428474 A | 3/2016 |
| CN | 106299072 A | 1/2017 |
| JP | 2008130875 A | 6/2008 |

OTHER PUBLICATIONS

Chinese Office Action (first) from Chinese Patent Application No. 201610876732.6, dated Feb. 26, 2018.

* cited by examiner

LIGHT EMITTING DIODE CHIP

CROSS-REFERENCE TO RELATED APPLICATIONS

This application is a National Stage Application of International Application No. PCT/CN2017/104319, filed 29 Sep. 2017, which claims the benefit of Chinese Patent Application No. 201610876732.6, filed on Sep. 30, 2016, and entitled "LIGHT EMITTING DIODE CHIP", the entire disclosures of which are incorporated herein by reference. To the extent appropriate, a claim of priority is made to each of the above disclosed applications.

TECHNICAL FIELD

The present disclosure generally relates to light emitting diode manufacturing field, and more particularly, to a light emitting diode chip.

BACKGROUND

A light emitting diode (LED) is a semiconductor device that is excited to generate light in response to a current to produce light of various colors. Due to high band gap width, high luminous efficiency, high electron saturation drift speed, and stable chemical properties, group III-V compound semiconductors represented by gallium nitride (GaN) have huge application is potential in photoelectron device fields, such as high-brightness blue LED or blue lasers, and has aroused widespread concern.

From the view of structures, LEDs can be classified into normal structure, flip-chip structure and vertical structure. LEDs with the vertical structure possess advantages, like high thermal efficiency, large load current, high luminous intensity, low power consumption and long life span. Therefore, LEDs with the vertical structure as high-power LEDs draw more and more attention and are studied more and more in the industry.

Two electrodes of an LED with the vertical structure are located on a side of an epitaxial layer of the LED respectively. Through a patterned electrode, a current flows almost vertically through the epitaxial layer of the LED, and the current flowing in a lateral direction is less, which may effectively mitigate a current congestion problem, and be conducive to improvement of luminous efficiency.

However, in existing techniques, LED chips always have a complicated process and high cost.

SUMMARY

In embodiments of the present disclosure, an LED chip is provided to simplify process and reduce cost.

In an embodiment of the present disclosure, an LED chip is provided, including: an operation substrate having a functional surface, a bottom surface opposite to the functional surface, and a side surface between the functional surface and the bottom surface; a first conductive layer disposed on the functional surface of the operation substrate; a die disposed on the first conductive layer, wherein the die includes a first semiconductor layer and a second semiconductor layer, the first semiconductor layer and the second semiconductor layer have different conductivity types, and the first semiconductor layer is electrically connected with the first conductive layer; a first electrode layer disposed on the bottom surface of the operation substrate and electrically connected with the first conductive layer; and a second electrode layer disposed on the bottom surface and the side surface of the operation substrate, and a side surface of the first conductive layer, wherein the second electrode layer is electrically connected with the second semiconductor layer, and a first isolation layer is disposed between the second electrode layer and the first conductive layer.

Optionally, the second semiconductor layer may be disposed at a side of the first semiconductor layer which is away from the operation substrate, and the first isolation layer is further disposed on a sidewall of the die.

Optionally, the operation substrate may be insulating, the first conductive layer may be in contact with the first semiconductor layer of the die, the first electrode layer further covers the side surface of the first conductive layer and the side surface of the operation substrate, and the second electrode layer covers the first isolation layer and is in contact with the second semiconductor layer.

Optionally, the operation substrate may be conductive, the first conductive layer may be in contact with the functional surface of the operation substrate, the first semiconductor layer of the die may be in contact with the first conductive layer, the first electrode layer may be in contact with the operation substrate, the second electrode layer covers the first isolation layer and may be in contact with the second semiconductor layer, and the first isolation layer may be further disposed between the operation substrate and the second electrode layer.

Optionally, the second semiconductor layer may be disposed between the first semiconductor layer and the operation substrate, the first conductive layer may be in contact with the first semiconductor layer through a first plug which penetrates through the second semiconductor layer, and the LED chip further includes: a second conductive layer disposed between the second semiconductor layer and the first conductive layer, the second conductive layer being in contact with the second semiconductor layer; and a second isolation layer disposed between the second conductive layer and the first conductive layer and disposed on a sidewall of the first plug, wherein the second electrode layer is in contact with a portion of a surface of the second conductive layer.

Optionally, the operation substrate may be insulating, the first electrode layer further covers the side surface of the first conductive layer and the side surface of the operation substrate, and the second electrode layer covers the first isolation layer and is in contact with the second conductive layer.

Optionally, the operation substrate may be conductive, the first electrode layer is in contact with the operation substrate, the second electrode layer covers the first isolation layer and is in contact with the second conductive layer, and the first isolation layer may be further disposed between the operation substrate and the second electrode layer.

Optionally, the first isolation layer completely covers the bottom surface, and the first electrode layer may be connected with the bottom surface of the operation substrate through at least one second plug which penetrates through the first isolation layer.

Optionally, there may be a plurality of second plugs.

Optionally, the operation substrate may be conductive, and a material of the operation substrate may include silicon, germanium, silicon carbide, copper, tungsten, molybdenum, tungsten copper alloy or molybdenum copper alloy.

Optionally, the operation substrate may be insulating, and a material of the operation substrate may include titanium oxide, silicon oxide, polymer, glass, aluminum nitride, alumina, zirconia, silicon nitride, YAG series of ceramics, boron oxide, boron nitride or cymbals oxide.

Optionally, a material of the first and second electrode layers may include any combination selected from Cr, Pt, Au, TiW, Ti, Ni, Cu, Ag, Al, W, zinc oxide and ITO.

Optionally, the LED chip may be a GaN-based LED chip, and the die may include a p-type GaN layer, an n-type GaN layer, and a quantum well layer between the p-type GaN layer and the n-type GaN layer, wherein the first semiconductor layer is a p-type GaN layer, and the second semiconductor layer is an n-type GaN layer; or, the first semiconductor layer is an n-type GaN layer, and the second semiconductor layer is a p-type GaN layer.

Embodiments of the present disclosure may provide following advantages. In embodiments of the present disclosure, the first electrode layer and the second electrode layer are disposed on the bottom surface of the operation substrate, the first electrode layer is electrically connected with the first conductive layer, and the second electrode layer is electrically connected with the second semiconductor layer. The first electrode layer and the second electrode layer are formed after the LED die is formed. Therefore, a dicing process and a packaging process are not required, thus, process steps are simplified and process cost is reduced, which is conducive to achieve "free packaging" technology. In addition, the LED chip provided in embodiments of the present disclosure can be used directly, and meet different color requirements by cooperating with a phosphor process.

Further, the first electrode layer may be electrically connected with the first conductive layer through the conductive substrate or electrically connected with the conductive substrate through a plurality of second plugs which penetrate through the first isolation layer, which may facilitate reduction of resistance of the first electrode layer and enhancement of load carrying capacity of the first electrode layer to high current, and improve performance of the LED chip.

DETAILED DESCRIPTION

From the background, in the existing techniques, LED chips have complicated processes and high cost. Reasons for the complicated processes and high cost are explained in conjunction with a light-emitting diode chip below.

Figure 1:
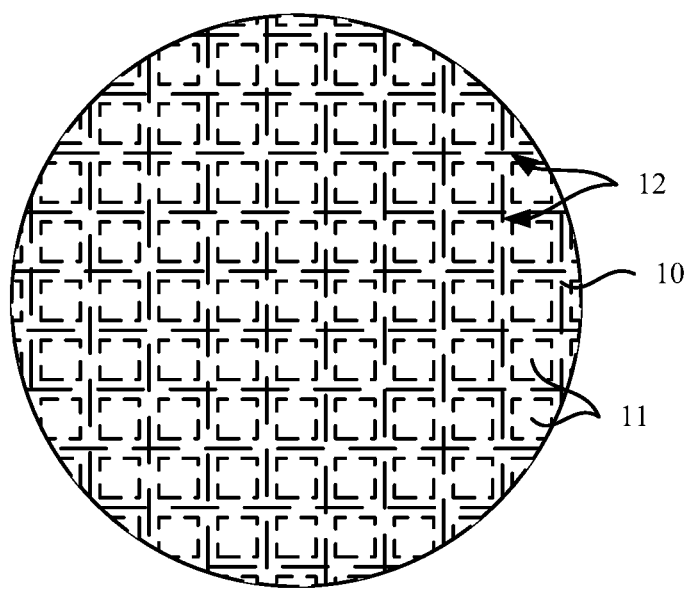
FIGS. 1 and 2 schematically illustrate structural diagrams corresponding to steps in a process for forming an LED chip in existing techniques.
Figure 2:
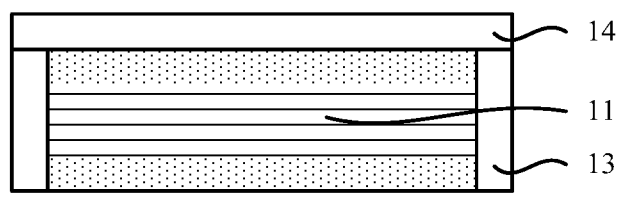

FIGS. 1 and 2 schematically illustrate structural diagrams corresponding to steps in a process for forming an LED chip in the existing techniques.

The process for forming the LED chip may include following steps.

First, referring to FIG. 1, at a manufacturing end, a plurality of dies 11 are formed on a surface of a substrate 10, and a dicing track 12 is provided between adjacent dies 11.

Referring to FIG. 2, at a packaging end, the plurality of dies 11 on the substrate 10 are separated along the dicing track 12 (as shown in FIG. 1) by a dicing process to obtain single dies 11. Afterwards, the single dies 11 are packaged by a packaging process, wherein the packaging process includes: forming a protective layer 13 on a sidewall of the die 11; forming a fluorescent layer 14 on the protective layer 13 and the die 11; and forming an electrode.

As shown in FIGS. 1 and 2, to form the LED chip, the dicing process and the packaging process at the packaging end are required after the dies 11 are formed, which results in the complicated processes and high cost and does not conform to a current technology trend of "free package".

Therefore, embodiments of the present disclosure provide an LED chip, including: an operation substrate having a functional surface, a bottom surface opposite to the functional surface, and a side surface between the functional surface and the bottom surface; a first conductive layer disposed on the functional surface of the operation substrate; a die disposed on the first conductive layer, wherein the die includes a first semiconductor layer and a second semiconductor layer, the first semiconductor layer and the second semiconductor layer have different conductivity types, and the first semiconductor layer is electrically connected with the first conductive layer; a first electrode layer disposed on the bottom surface of the operation substrate and electrically connected with the first conductive layer; and a second electrode layer disposed on the bottom surface and the side surface of the operation substrate, and a side surface of the first conductive layer, wherein the second electrode layer is electrically connected with the second semiconductor layer, and a first isolation layer is disposed between the second electrode layer and the first conductive layer.

In embodiments of the present disclosure, the first electrode layer and the second electrode layer are disposed on the bottom surface of the operation substrate, the first electrode layer is electrically connected with the first conductive layer, and the second electrode layer is electrically connected with the second semiconductor layer. The first electrode layer and the second electrode layer are formed after the LED die is formed. Therefore, a dicing process and a packaging process are not required, thus, process steps are simplified and process cost is reduced, which is conducive to achieve "free packaging" technology.

In order to clarify the object, characteristic and advantages of embodiments of the present disclosure, embodiments of present disclosure will be described clearly in detail in conjunction with accompanying drawings.

Figure 3:
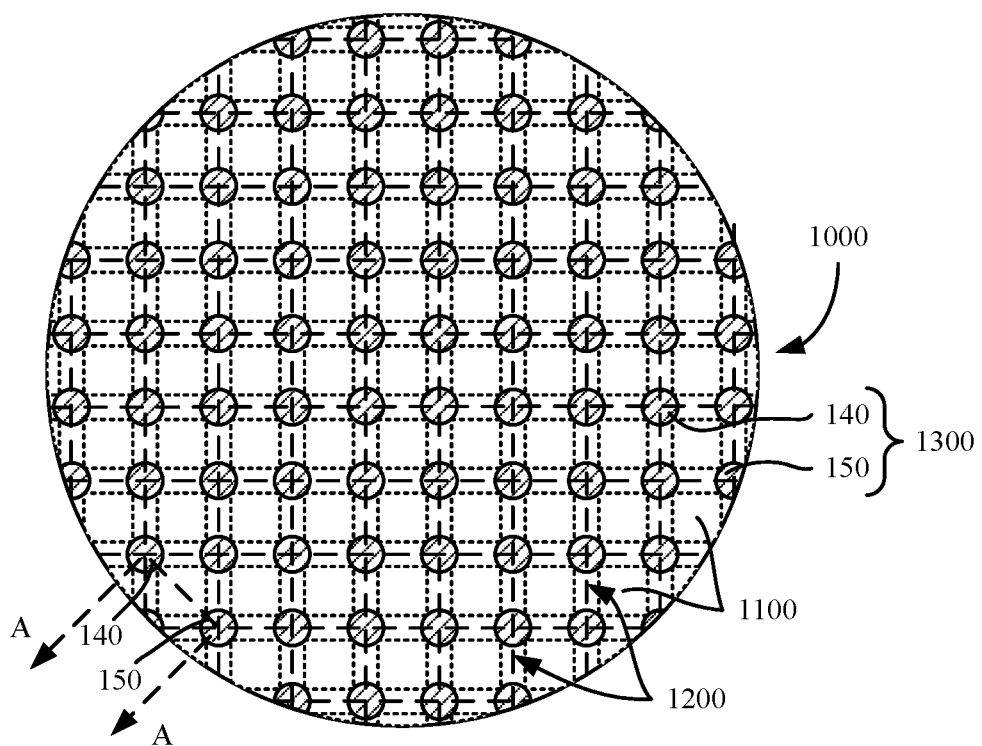
FIG. 3 schematically illustrates a top view of a wafer where an LED chip is formed according to an embodiment.
Figure 4:
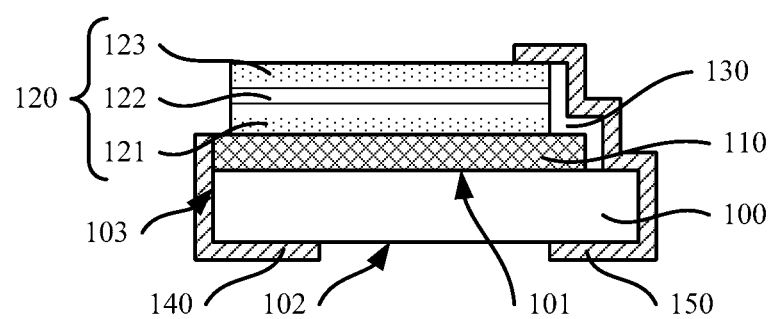
FIG. 4 schematically illustrates a sectional view of the LED chip along an A-A line as shown in FIG. 3.

Referring to FIGS. 3 and 4, structural diagrams of an LED chip according to an embodiment are schematically illustrated.

FIG. 3 schematically illustrates a top view of a wafer where an LED chip is formed according to an embodiment, and FIG. 4 schematically illustrates a sectional view of the LED chip along an A-A line as shown in FIG. 3.

The LED chip 1100 includes: an operation substrate 100 having a functional surface 101, a bottom surface 102 opposite to the functional surface 101, and a side surface 103 between the functional surface 101 and the bottom surface 102; a first conductive layer 110 disposed on the functional surface 101 of the operation substrate 100; a die 120 disposed on the first conductive layer 110, wherein the die 120 includes a first semiconductor layer 121 and a second semiconductor layer 123, the first semiconductor layer 121 and the second semiconductor layer 123 have different conductivity types, and the first semiconductor layer 121 is electrically connected with the first conductive layer 110; a first electrode layer 140 disposed on the bottom surface 102 of the operation substrate 100 and electrically connected with the first conductive layer 110; and a second electrode layer 150 disposed on the bottom surface 102 and the side surface 103 of the operation substrate 100, and a side surface of the first conductive layer 110, wherein the second electrode layer 150 is electrically connected with the second semiconductor layer 123, and a first isolation layer 130 is disposed between the second electrode layer 150 and the first conductive layer 110.

Specifically, as shown in FIG. 3, a plurality of LED chips 1100 are formed on a wafer 1000, and dicing tracks 1200 are provided between adjacent LED chips 1100 for performing a dicing process to obtain single LED chips 1100.

The wafer 1000 is also formed with a plurality of metal layers 1300 disposed at a position where the dicing tracks 1200 intersect. The metal layers 1300 are used to form the first electrode layer 140 and the second electrode layer 150 of the LED chip 1100 on both sides of the dicing track 1200 after the dicing process is performed.

It should be noted that, in the embodiment, the LED chip 1100 is projected on a surface of the wafer 1000 as a square, and the first electrode layer 140 and the second electrode layer 150 are disposed at two opposite vertical angles of the LED chip 1100 respectively.

The plurality of LED chips 1100 are arranged in an array, so that the dicing tracks 1200 extend in a row or column direction of the LED chips 1100 arranged in the array. The metal layer 1300 is disposed at a position where the dicing tracks 1200 extending in the row direction intersect with the dicing tracks 1200 extending in the column direction. The metal layer 1300 is divided into four portions after dicing for the first electrode layer 140 and the second electrode layer 150 of the four LED chips 1100 disposed around the metal layer 1300, respectively.

Referring to FIG. 4, a sectional view of the LED chip along the A-A line as shown in FIG. 3 is shown. It should be noted that, as the first electrode layer 140 and the second electrode layer 150 are disposed at the opposite vertical angles of the LED chip 1100, the A-A line is along a diagonal line of the LED chip 1100.

The operation substrate 100 is used to provide a process operating platform.

In some embodiments, the operation substrate 100 is insulating. Specifically, a material of the operation substrate 100 is AlN. In other embodiments, the material of the operation substrate may be an insulating material, such as Al$_2$O$_3$, which is excellent in heat dissipation and suitable as a substrate. In other embodiments, the material of the operation substrate includes titanium oxide, silicon oxide, polymer, glass, aluminum nitride, alumina, zirconia, silicon nitride, YAG series of ceramics, boron oxide, boron nitride or cymbals oxide.

The operation surface 101 of the operation substrate 100 is used for carrying out the process of forming the LED chip and faces toward a light emitting direction of the LED chip, the bottom surface 102 is disposed opposite to the functional surface 101 and faces backward the light emitting direction of the LED chip, and the side surface 103 is used to connect the bottom surface 102 with the functional surface 101.

In some embodiments, the side surface 103 is perpendicular to the bottom surface 102, and the functional surface 101 is equal in size to the bottom surface 102. In some embodiments, the side surface 103 may intersect with the functional surface 101 and the bottom surface 102 in a particular angle, so that an area of the functional surface 101 is larger than an area of the bottom surface 102 or the area of the functional surface 101 is smaller than the area of the bottom surface 102.

The first conductive layer 110 is used to realize electrical connection of the die 120 with electrodes. In some embodiments, the first conductive layer 110 covers a portion of the functional surface 101 of the operation substrate 100.

The first conductive layer 110 may have a single-layer structure or a laminated structure. In some embodiments, the first conductive layer 110 has a single-layer structure made of Au. In some embodiments, the material of the first conductive layer may be selected from conductive materials suitable for realizing electrical connection, such as Cr, Pt, Au, TiW, Ti, Ni, Cu, Ag, Al, W, zinc oxide or ITO. Alternatively, the first conductive layer 110 may be a laminated structure including an Au layer, an ITO layer and an Al layer. In addition, layers of the laminated structure may be same or different in size. For example, in the first conductive layer 110 having the laminated structure, a size of a middle layer is smaller than that of other layers.

In addition, in some embodiments, the first conductive layer may be a laminated structure formed by multiple conductive materials. The first conductive layer having the laminated structure may include conductive films with different functions, such as a metal reflective layer for reflecting light, a barrier layer for preventing diffusion of atoms of the conductive material, and an adhesive layer for improving strength of adhesion with the operation substrate and the die.

The die 120 is used to realize carrier recombination luminescence.

The first semiconductor layer 121 and the second semiconductor layer 123 having different conductivity types constitute a pn junction structure. In the pn junction structure, electron-hole recombination occurs, and excess energy is emitted in the form of light energy to realize luminescence.

In some embodiments, the LED chip may be a GaN-based LED chip, and the die may include a p-type GaN layer, an n-type GaN layer, and a quantum well layer between the p-type GaN layer and the n-type GaN layer.

The first semiconductor layer 121 is a p-type GaN layer, the second semiconductor layer is an n-type GaN layer, and the die 120 further includes a quantum well layer 122 disposed between the first semiconductor layer 121 and the second semiconductor layer 123.

In some embodiments, the die 120 covers the surface of the first conductive layer 110, and the LED chip is a vertical structure. That is, the second semiconductor layer 123 is disposed at a side of the first semiconductor layer 121 which is away from the operation substrate 100. Therefore, the first conductive layer 110 is in contact with the first semiconductor layer 121 of the die 120, and the second semiconductor layer 123 is disposed at the side of the first semiconductor layer 121 which is away from the operation substrate 100.

Specifically, the first semiconductor layer 121 covers the surface of the first conductive layer 110, the quantum well layer 122 covers the surface of the first semiconductor layer 121, and the second semiconductor layer 123 covers a surface of the quantum well layer 122.

In some embodiments, the first semiconductor layer is an n-type GaN layer, and the second semiconductor layer is a p-type GaN layer.

It should be noted that, the second semiconductor layer 123, the quantum well layer 122, and the first semiconductor layer 121 may be successively formed on a growing substrate by a growing process to form the die 120. Afterward, the die 120 is transferred onto the operation substrate 100 whose functional surface 101 has the first conductive layer 110 formed thereon by a substrate transferring process, so that the first semiconductor layer 121 of the die 120 is in contact with the first conductive layer 110.

The first electrode layer 140 is used to realize electrical connection between the first semiconductor layer 121 and external circuits. In some embodiments, the first semiconductor layer 121 is a p-type GaN layer, and the first electrode layer 140 is used to connect the first semiconductor layer 121 to a negative electrode of power supply.

In particular, the first electrode layer 140 is electrically connected with the first semiconductor layer 121 through the first conductive layer 110. A material of the first electrode layer 140 may be any combination selected from Cr, Pt, Au, TiW, Ti, Ni, Cu, Ag, Al, W, zinc oxide or ITO. In other embodiments, the material of the first electrode layer may be other conductive materials suitable for forming an electrode.

As the operation substrate 100 is insulating, the first electrode layer 140 also covers the side surface of the first conductive layer 110 and the side face 103 of the operation substrate 100. Specifically, the first electrode layer 140 includes a first contact portion (not shown) disposed on the bottom surface 102 and a first extension portion (not shown) connected with the first contact portion. The first extension portion covers the side surface 103 of the operation substrate 100 and the side surface of the first conductive layer 110, and is in contact with the side surface of the first conductive layer 110.

The second electrode layer 150 is used to realize electrical connection of the second semiconductor layer 122 with an external circuit. In some embodiments, the second semiconductor layer 123 is an n-type GaN layer, and the second electrode layer 150 is used to connect the second semiconductor layer 123 with the negative electrode of voltage.

In some embodiments, the second electrode layer 150 is in contact with the second semiconductor layer 123 to realize electrical connection. Specifically, the second semiconductor layer 123 has a connection surface connected with the quantum well layer 122 and a light emitting surface opposite to the connection surface, and the second electrode layer 150 covers a portion of the light emitting surface. A material of the second electrode layer 150 may be any combination selected from Cr, Pt, Au, TiW, Ti, Ni, Cu, Ag, Al, W, zinc oxide or ITO. In other embodiments, the material of the second electrode layer may be other conductive materials suitable for forming an electrode.

As the second electrode layer 150 is disposed on the side surface of the first conductive layer 110, the first isolation layer 130 is used to realize electrical isolation between the second electrode layer 150 and the first conductive layer 110, so as to prevent the second electrode layer 150 from short-circuiting with the first electrode layer 140 through the first conductive layer 110.

In some embodiments, as the second semiconductor layer 123 is disposed at the side of the first semiconductor layer 121 which is away from the operation substrate 100, the second electrode layer 150 is disposed on the side surfaces of the first semiconductor layer 121 and the quantum well layer 122. Therefore, the first isolation layer 110 is also disposed on a sidewall of the die 120 to realize electrical isolation between the second electrode layer 150 and the quantum well layer 122 and the first semiconductor layer 121, which avoids a short circuit is phenomenon that affects functions of the LED chip. Therefore, the second electrode layer 150 covers the first isolation layer 110 and is in contact with the second semiconductor layer 123.

As the operation substrate 100 is insulating, the second electrode layer 150 is disposed on the side surface of the first conductive layer 110 and covers the side surface 103 of the operation substrate 100. In particular, the second electrode layer 150 includes a second contact portion (not shown) on the bottom surface 102 and a second extension portion connected with the second contact portion. The second extension portion covers the side surface 103 of the operation substrate 100, a surface of the first isolation layer 130 and a portion of the surface of the second semiconductor layer 123, and is in contact with the second semiconductor layer 123.

Referring to FIG. 3, in some embodiments, the second semiconductor layer 123, the quantum well layer 122 and the first semiconductor layer 121 may be formed successively on a growing substrate to form a die film. Afterward, the die film is transferred onto the operation substrate whose functional surface has a conductive film formed thereon by a substrate transferring process, and the die film and the conductive film on the operation substrate are patterned to form a plurality of dies 120 (as shown in FIG. 3), the first conductive layer 110 and dicing tracks 1200 disposed between the die 120 and the operation substrate 100. Afterward, a through hole penetrating through the operation substrate 100 is formed at a position where the dicing tracks 1200 intersect, and the metal layer 1300 is formed in the through hole. Finally, the metal layer 1300 is divided along the dicing tracks 1200 by a dicing process to form the first electrode layer 140 and the second electrode layer 150.

Figure 5:
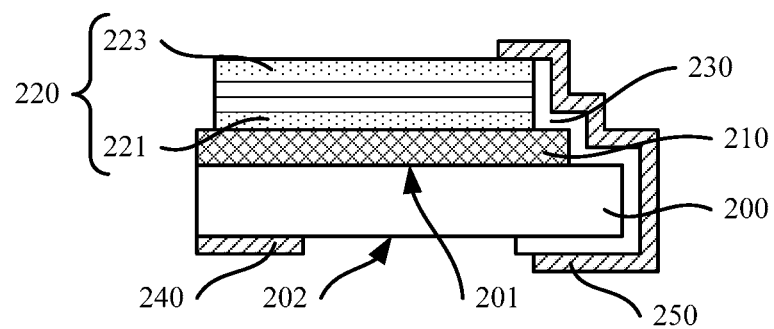
FIG. 5 schematically illustrates a structural diagram of an LED chip according to an embodiment.

FIG. 5 schematically illustrates a structural diagram of an LED chip according to an embodiment.

In some embodiments, the operation substrate 200 is conductive. Specifically, the material of the operation substrate 200 is Si. In other embodiments, the material of the operation substrate may be a metal such as copper, tungsten, molybdenum, or an alloy thereof, or a semiconductor material, such as silicon carbide or germanium, or other conductive material which is excellent in heat dissipation and suitable as a substrate.

The first conductive layer 210 on the functional surface 201 of the operation substrate 200 is in contact with the functional surface 201 of the operation substrate 200. Specifically, the first conductive layer 210 covers a portion of or all of the functional surface 201.

The first semiconductor layer 221 of the die 220 is in contact with the first conductive layer 210. Specifically, the first semiconductor layer 221 covers a portion of or all of the surface of the first conductive layer 210 opposite to the operation substrate 200.

The first electrode layer 240 is in contact with the operation substrate 200. In particular, the first electrode layer 240 covers a portion of the bottom surface 202 of the operation substrate 200. [

The operation substrate 200 is further used to realize electrical connection between the first electrode 240 and the first conductive layer 210. Specifically, the first electrode layer 240 is electrically connected with the first semiconductor layer 221 through the operation substrate 200 and the first conductive layer 210. As the operation substrate 200 and the first conductive layer 210 have a relatively large area, the action is advantageous for reducing current density, increasing current carrying capacity of the LED chip, and improving performance of the LED chip.

As the second electrode layer 250 is disposed on the bottom surface and the side surface of the operation substrate 200, and the side surface of the first conductive layer 210, the first isolation layer 230 is further disposed between the operation substrate 200 and the second electrode layer 250. Therefore, the first isolation layer 230 is disposed among the first conductive layer 210, the operation substrate 200 and the second electrode layer 250, so that the second electrode layer 250 can be prevented from short-circuiting with the first electrode layer 240 through the operation substrate 200 or the first conductive layer 210, which ensures normal operation of the LED chip. The second electrode layer 250 covers the first isolation layer 230 and is in contact with the second semiconductor layer 223.

Figure 6:
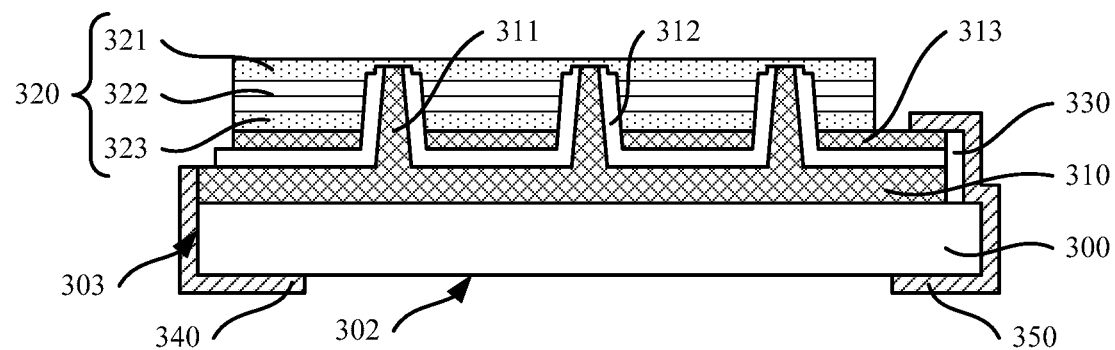
FIG. 6 schematically illustrates a structural diagram of an LED chip according to an embodiment.

FIG. 6 schematically illustrates a structural diagram of an LED chip according to an embodiment.

In some embodiments, the LED chip is a vertical flip chip structure in which the second semiconductor layer 323 is disposed between the first semiconductor layer 321 and the operation substrate 300. The second semiconductor layer 323 is disposed on the first conductive layer 310, the quantum well layer 322 is disposed on the second semiconductor layer 323, and the first semiconductor layer 231 is disposed on the quantum well layer 322.

The first conductive layer 310 is in contact with the first semiconductor layer 321 through a first plug 311 penetrating through the second semiconductor layer 323.

Specifically, the first plug 311 protrudes from the surface of the first conductive layer 310 along a direction backward the operation substrate 300, penetrates through the second semiconductor layer 323, the quantum well layer 322, and a portion of the first semiconductor layer 321, and is in contact with the first semiconductor layer 321.

It should be noted that, in some embodiments, the number of the first plugs 311 is more than one. Electrical connection between the first conductive layer 313 and the first semiconductor layer 321 is achieved by using the plurality of first plugs 311 to improve uniformity of a vertical current in the die 320 and to improve performance of the LED chip.

The LED chip further includes: a second conductive layer 313 disposed between the second semiconductor layer 323 and the first conductive layer 310, the second conductive layer 313 being in contact with the second semiconductor layer 323; and a second isolation layer 312 disposed between the second conductive layer 313 and the first conductive layer 310 and on a sidewall of the first plugs 311.

As the first plugs 311 protrude from the surface of the first conductive layer 310, the second conductive layer 313 is disposed on the first conductive layer 310 exposed by the first plugs 311, that is, the first plugs 311 also penetrate through the second conductive layer 313. Therefore, the second semiconductor layer 323 covers a portion of the surface of the first plugs 311 which exposes the second conductive layer 313.

As the first conductive layer 310 is electrically connected with the first semiconductor layer 321 through the first plugs 311, the second isolation layer 312 is used to realize electrical isolation between the second conductive layer 313 and the first conductive layer 310 and the first plugs 311, and electrical isolation between the first plugs 311 and the second semiconductor layer 323 and the quantum well layer 322.

The second isolation layer 312 is disposed between the second conductive layer 313 and the first conductive layer 310, and also among the first plugs 311, the second semiconductor layer 323 and the quantum well layer 322.

In some embodiments, the operation substrate 300 is insulating.

The first electrode layer 340 also covers the side surface of the first conductive layer 310 and the side surface 303 of the operation substrate 300. Specifically, the first electrode layer 140 includes a first contact portion (not shown) disposed on the bottom surface 302 and a first extension portion (not shown) connected with the first contact portion. The first extension portion covers the side surface 303 of the operation substrate 300 and the side surface of the first conductive layer 310, and is in contact with the side surface of the first conductive layer 310.

The second electrode layer 350 is disposed on the side surface of the first conductive layer 310 and covers the side surface 303 of the operation substrate 300. In some embodiments, the first isolation layer 330 covers the side surfaces of the first conductive layer 310, the second isolation layer 312 and the second conductive layer 313, so that the second electrode layer 350 covers the first isolation layer 330 and is in contact with the second conductive layer 313.

In particular, the second electrode layer 350 includes a second contact portion (not shown) disposed on the bottom surface 302 and a second extension portion connected with the second contact portion, the second extension portion covering the side surface 303 of the operation substrate 300, the surface of the first isolation layer 330, and a portion of the surface of the second conductive layer 313 exposed by the die 320, and being in contact with the second conductive layer 313.

Figure 7:
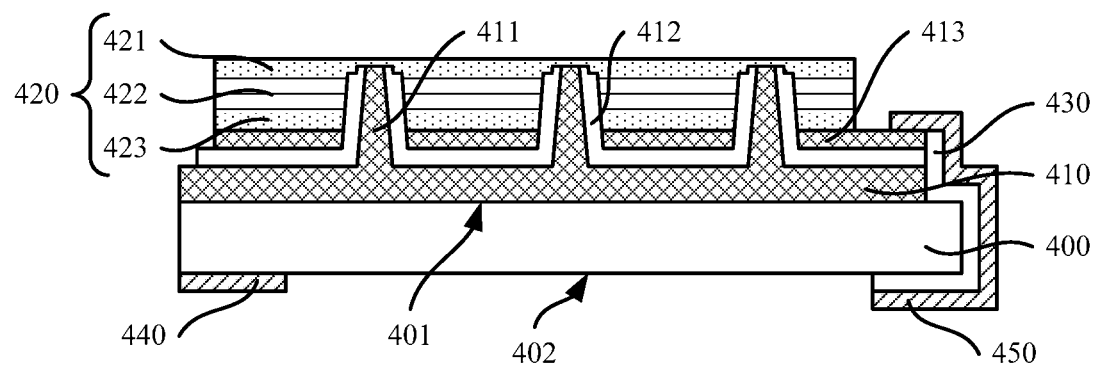
FIG. 7 schematically illustrates a structural diagram of an LED chip according to an embodiment.

FIG. 7 schematically illustrates a structural diagram of an LED chip according to an embodiment.

In some embodiments, the operation substrate 400 is conductive.

The first conductive layer 410 is in contact with the operation substrate 400. In particular, the first conductive layer 410 covers a portion of or all of the functional surfaces 401. The first conductive layer 410 is in contact with the first semiconductor layer 421 of the die 420 through the first plug 411.

The first electrode layer 440 is in contact with the operation substrate 400. In particular, the first electrode layer 440 covers a portion of the bottom surface 402 of the operation substrate 400.

The operation substrate 400 is further used to realize electrical connection between the first electrode 440 and the first semiconductor layer 421. Specifically, the first electrode layer 440 is electrically connected with the first semiconductor layer 421 through the operation substrate 400, the first conductive layer 410 and the first plugs 411.

As the second electrode layer 450 is disposed on the bottom surface and the side surface of the operation substrate 400, and the side surface of the first conductive layer 410, the first isolation layer 430 is also provided between the operation substrate 400 and the second electrode layer 450. Therefore, the first isolation layer 430 is disposed among the first conductive layer 410, the operation substrate 400 and the second electrode layer 450, and the second electrode layer 450 covers the first isolation layer 430 and is in contact with the second conductive layer 413.

Figure 8:
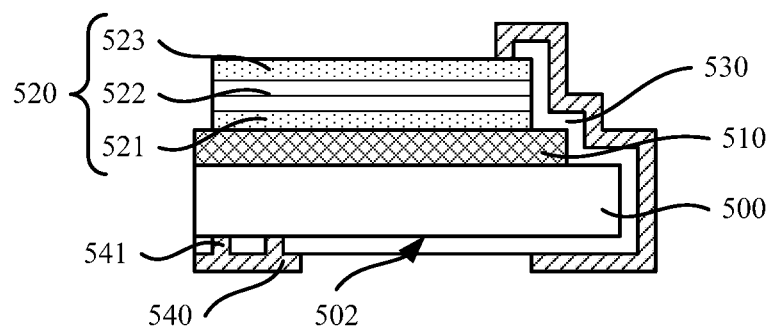
FIG. 8 schematically illustrates a structural diagram of an LED chip according to an embodiment.

FIG. 8 schematically illustrates a structural diagram of an LED chip according to an embodiment.

Similar features of the embodiment shown in FIG. 8 and the foregoing embodiments are not described in detail here. Differences between the embodiment shown in FIG. 8 and the foregoing embodiments lie in that the first isolation layer 530 completely covers the bottom surface 502. Therefore, in the embodiment, the first electrode layer 540 is disposed on a surface of the first isolation layer 530 which is away from the operation substrate 500.

The operation substrate 500 is conductive. To realize electrical connection with the first conductive layer 510 to further achieve electrical connection with the first semiconductor layer 521, the first electrode layer 540 is electrically connected with the bottom surface 502 of the operation substrate 500 through the second plugs 541 penetrating through the first isolation layer 530.

In some embodiments, the number of the second plugs 541 is more than one. Electrical connection between the first electrode layer 540 and the operation substrate 500 is realized by using a plurality of second plugs 541, which may effectively reduce resistance and increase current, thereby improving performance of the LED chip.

It should be noted that, in the embodiment, the LED chip is a vertical structure in which the second semiconductor layer 523 is disposed at the side of the first semiconductor layer 521 which is away from the operation substrate 500, and the first electrode layer 540 is electrically connected with the first semiconductor layer 521 through the second plugs 541, the operation substrate 500 and the first conductive layer 510. In other embodiments, the LED chip may be a vertical flip-chip structure in which the second semiconductor layer is disposed between the first semiconductor layer and the operation substrate, and the first electrode layer is electrically connected with the first semiconductor layer through the second plugs, the operation substrate, the first conductive layer and the first plugs.

Figure 9:
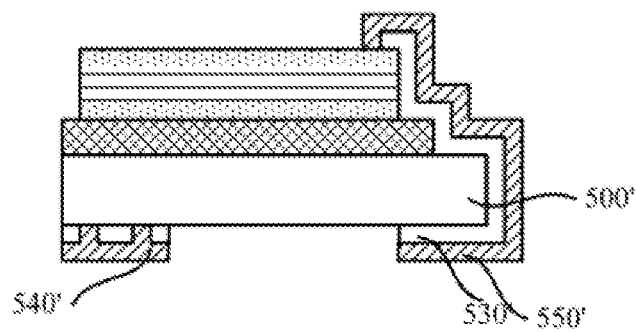
FIG. 9 schematically illustrates a structural diagram of an LED chip according to an embodiment.

It should be noted that, in the embodiment, the first isolation layer completely covers the bottom surface of the operation substrate. However, the present invention is not limited thereto. In the embodiment shown in FIG. 9, the first isolation layer 530' on the bottom surface of the operation substrate may partially covers the bottom surface of the operation substrate 500', and be disposed between the first electrode layer 540' and the operation substrate 500', or between the second electrode layer 550' and the operation substrate 500', as long as insulation between the electrode layer and the operation substrate 500' can be achieved.

From above, in embodiments of the present disclosure, the first electrode layer and the second electrode layer are disposed on the bottom surface of the operation substrate, the first electrode layer is electrically connected with the first conductive layer, and the second electrode layer is electrically connected with the second semiconductor layer. The first electrode layer and the second electrode layer are formed after the LED die is formed. Therefore, a dicing process and a packaging process are not required, thus, process steps are simplified and process cost is reduced, which is conducive to achieve "free packaging" technology. Further, the first electrode layer may be electrically connected with the first conductive layer through the conductive substrate or electrically connected with the conductive substrate through a plurality of second plugs which penetrate through the first isolation layer, which may facilitate reduction of resistance of the first electrode layer and enhancement of load carrying capacity of the first electrode layer to high current, and improve performance of the LED chip.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A light emitting diode (LED) chip, comprising:
an operation substrate having a functional surface, a bottom surface opposite to the functional surface, and a side surface between the functional surface and the bottom surface;
a first conductive layer disposed on the functional surface of the operation substrate;
a die disposed on the first conductive layer, wherein the die comprises a first semiconductor layer and a second semiconductor layer, the first semiconductor layer and the second semiconductor layer have different conductivity types, and the first semiconductor layer is electrically connected with the first conductive layer;
a first electrode layer disposed on the bottom surface of the operation substrate and electrically connected with the first conductive layer; and
a second electrode layer disposed on the bottom surface and the side surface of the operation substrate, and a side surface of the first conductive layer, wherein the second electrode layer is electrically connected with the second semiconductor layer, and a first isolation layer is disposed between the second electrode layer and the first conductive layer,
wherein the second semiconductor layer is disposed between the first semiconductor layer and the operation substrate, the first conductive layer is in contact with the first semiconductor layer through a first plug which penetrates through the second semiconductor layer, and the LED chip further comprises:
a second conductive layer disposed between the second semiconductor layer and the first conductive layer, the second conductive layer being in contact with the second semiconductor layer; and
a second isolation layer disposed between the second conductive layer and the first conductive layer and disposed on a sidewall of the first plug,
wherein the second electrode layer is in contact with a portion of a surface of the second conductive layer.

2. The LED chip according to claim 1, wherein the operation substrate is insulating, the first electrode layer further covers the side surface of the first conductive layer and the side surface of the operation substrate, and the second electrode layer covers the first isolation layer and is in contact with the second conductive layer.

3. The LED chip according to claim 1, wherein the operation substrate is conductive, the first electrode layer is in contact with the operation substrate, the second electrode layer covers the first isolation layer and is in contact with the second conductive layer, and the first isolation layer is further disposed between the operation substrate and the second electrode layer.

4. A light emitting diode (LED) chip, comprising:
an operation substrate having a functional surface, a bottom surface opposite to the functional surface, and a side surface between the functional surface and the bottom surface;
a first conductive layer disposed on the functional surface of the operation substrate;
a die disposed on the first conductive layer, wherein the die comprises a first semiconductor layer and a second semiconductor layer, the first semiconductor layer and the second semiconductor layer have different conductivity types, and the first semiconductor layer is electrically connected with the first conductive layer;
a first electrode layer disposed on the bottom surface of the operation substrate and electrically connected with the first conductive layer; and a second electrode layer disposed on the bottom surface and the side surface of the operation substrate, and a side surface of the first conductive layer, wherein the second electrode layer is electrically connected with the second semiconductor layer, and a first isolation layer is disposed between the second electrode layer and the first conductive layer, wherein the second semiconductor layer is disposed on a side of the first semiconductor layer which is away from the operation substrate, and the first isolation layer is further disposed on a sidewall of the die, wherein the operation substrate is conductive, the first conductive layer is in contact with the functional surface of the operation substrate, the first semiconductor layer of the die is in contact with the first conductive layer, the first electrode layer is in contact with the operation substrate, the second electrode layer covers the first isolation layer and is in contact with the second semiconductor layer, and the first isolation layer is further disposed between the operation substrate and the second electrode layer, wherein the first isolation layer completely covers the bottom surface, and the first electrode layer is connected with the bottom surface of the operation substrate through at least one second plug which penetrates through the first isolation layer.

5. The LED chip according to claim 4, wherein there are a plurality of second plugs.

6. The LED chip according to claim 4, wherein the operation substrate is conductive, and a material of the operation substrate comprises silicon, germanium, silicon carbide, copper, tungsten, molybdenum, tungsten copper alloy or molybdenum copper alloy.

7. The LED chip according to claim 1, wherein a material of the first and second electrode layers comprises any combination selected from Cr, Pt, Au, TiW, Ti, Ni, Cu, Ag, Al, W, zinc oxide and ITO.

8. The LED chip according to claim 1, wherein the LED chip is a GaN-based LED chip, and the die comprises a p-type GaN layer, an n-type GaN layer, and a quantum well layer between the p-type GaN layer and the n-type GaN layer, wherein the first semiconductor layer is a p-type GaN layer, and the second semiconductor layer is an n-type GaN layer; or, the first semiconductor layer is an n-type GaN layer, and the second semiconductor layer is a p-type GaN layer.

9. The LED chip according to claim 3, wherein the first isolation layer completely covers the bottom surface, and the first electrode layer is connected with the bottom surface of the operation substrate through at least one second plug which penetrates through the first isolation layer.

10. The LED chip according to claim 3, wherein the operation substrate is conductive, and a material of the operation substrate comprises silicon, germanium, silicon carbide, copper, tungsten, molybdenum, tungsten copper alloy or molybdenum copper alloy.

11. The LED chip according to claim 2, wherein the operation substrate is insulating, and a material of the operation substrate comprises titanium oxide, silicon oxide, polymer, glass, aluminum nitride, alumina, zirconia, silicon nitride, YAG series of ceramics, boron oxide, boron nitride or cymbals oxide.

12. The LED chip according to claim 4, wherein a material of the first and second electrode layers comprises any combination selected from Cr, Pt, Au, TiW, Ti, Ni, Cu, Ag, Al, W, zinc oxide and ITO.

13. The LED chip according to claim 4, wherein the LED chip is a GaN-based LED chip, and the die comprises a p-type GaN layer, an n-type GaN layer, and a quantum well layer between the p-type GaN layer and the n-type GaN layer, wherein the first semiconductor layer is a p-type GaN layer, and the second semiconductor layer is an n-type GaN layer; or, the first semiconductor layer is an n-type GaN layer, and the second semiconductor layer is a p-type GaN layer.

* * * * *